US009599651B2

(12) United States Patent
Weiss et al.

(10) Patent No.: US 9,599,651 B2
(45) Date of Patent: Mar. 21, 2017

(54) SYSTEMS AND METHODS OF DETECTING GROUND FAULTS IN ENERGY STORAGE AND/OR GENERATION SYSTEMS THAT EMPLOY DC/AC POWER CONVERSION SYSTEMS

(71) Applicant: NEC Energy Solutions, Inc., Westborough, MA (US)

(72) Inventors: Harold Weiss, Wayland, MA (US); Gregory Tremelling, Berlin, MA (US)

(73) Assignee: NEC Energy Solutions, Inc., Westborough, MA (US)

( * ) Notice: Subject to any disclaimer, the term of this patent is extended or adjusted under 35 U.S.C. 154(b) by 245 days.

(21) Appl. No.: 14/625,838

(22) Filed: Feb. 19, 2015

(65) Prior Publication Data
US 2016/0245853 A1 Aug. 25, 2016

(51) Int. Cl.
*G01R 31/02* (2006.01)
*G01R 31/42* (2006.01)

(52) U.S. Cl.
CPC ........... *G01R 31/025* (2013.01); *G01R 31/42* (2013.01)

(58) Field of Classification Search
CPC .............................. G01R 31/025; G01R 31/42
See application file for complete search history.

(56) References Cited

U.S. PATENT DOCUMENTS

| 2011/0074215 A1 | 3/2011 | Vartanian et al. |
| 2012/0026631 A1* | 2/2012 | Kazemi ............... H02H 3/16 361/42 |
| 2013/0223113 A1 | 8/2013 | West |

OTHER PUBLICATIONS

International Search Report, PCT/US2016/018580, May 6, 2016, pp. 10.

* cited by examiner

*Primary Examiner* — David Gray
*Assistant Examiner* — Michael Harrison
(74) *Attorney, Agent, or Firm* — Chapin IP Law, LLC

(57) ABSTRACT

Systems and methods of detecting ground faults in energy storage and/or generation systems that can detect ground faults on the DC and/or AC side of an energy storage/generation system, and generate warning signals and/or shutdown at least part of the system upon detection of such ground faults. The systems and methods can monitor levels of DC voltages and amplitudes of AC voltages occurring on the positive and negative side of a DC bus with respect to ground on the DC side of the energy storage and/or generation system, and process the monitored DC voltage levels and AC voltage amplitudes to detect a ground fault. Having detected such a ground fault, the systems and methods can generate a warning signal and/or shutdown at least part of the system, for example, by disconnecting a DC energy system from the DC bus, and/or by disabling a DC-to-AC bidirectional inverter included in the system.

22 Claims, 6 Drawing Sheets

SYSTEMS AND METHODS OF DETECTING GROUND FAULTS IN ENERGY STORAGE AND/OR GENERATION SYSTEMS THAT EMPLOY DC/AC POWER CONVERSION SYSTEMS

TECHNICAL FIELD

The present application relates generally to energy storage and/or generation systems for use in electric power systems, and more specifically to systems and methods of detecting ground faults in such energy storage and/or generation systems that employ DC-to-AC power conversion systems.

BACKGROUND

A typical energy storage and/or generation system can include a direct current (DC) energy storage and/or generation system, a DC bus, a DC-to-alternating current (AC) power conversion system, and an isolation transformer. The DC energy storage and/or generation system can include a battery system containing a plurality of battery cells, and the DC-to-AC power conversion system can include a DC-to-AC bidirectional inverter. The DC bus is disposed between the battery system and the DC-to-AC bidirectional inverter, and the isolation transformer is disposed between the DC-to-AC bidirectional inverter and an AC power grid. The plurality of battery cells can be interconnected within the battery system in series and/or in parallel. For example, the plurality of battery cells can include rechargeable battery cells such as nickel-cadmium battery cells, nickel-metal-hydride battery cells, Lithium-ion battery cells, etc. In a typical mode of operation, the plurality of battery cells are connected to the DC bus, and operate to supply DC electric power onto the DC bus. The DC-to-AC bidirectional inverter converts the DC electric power supplied by the plurality of battery cells into AC electric power, which, in turn, is supplied through the isolation transformer to the AC power grid.

In the typical energy storage and/or generation system described herein, the DC-to-AC bidirectional inverter typically employs a high frequency (e.g., 5 kHz or higher) waveform synthesizer, requiring the AC side of the DC-to-AC power conversion system to be isolated from ground potential. Failure to isolate the AC side of the DC-to-AC power conversion system from ground potential can cause a high frequency AC signal (e.g., 5 kHz or higher) to be impressed on the DC side of the DC-to-AC bidirectional inverter with respect to ground potential, possibly damaging electrical components connected between the DC bus and ground, and/or coupling into noise-sensitive monitoring, control, and/or communication circuits. Such a failure in maintaining proper isolation of the AC side of the DC-to-AC power conversion system from ground potential can result from a ground fault caused by a low resistance or low impedance path from the AC side of the DC-to-AC power conversion system to ground.

Moreover, safety concerns dictate that the DC side of the DC-to-AC power conversion system also be isolated from ground potential. If one side (positive or negative) of the DC bus were inadvertently or deliberately connected to ground potential, then a ground fault occurring on the other side (negative or positive) of the DC bus might result in a dangerously high current condition. In this case, such a ground fault can be caused by a low resistance path from the positive or negative side of the DC bus to ground, or a low resistance path occurring between the series and/or parallel-connected battery cells and ground.

It would therefore be desirable to have more reliable systems and methods of detecting ground faults in energy storage and/or generation systems that employ DC-to-AC power conversion systems that can detect ground faults such as low resistance paths to ground from the DC side of a DC-to-AC power conversion system, as well as low resistance or low impedance paths to ground from the AC side of the DC-to-AC power conversion system. It would also be desirable to have such systems and methods of detecting ground faults in energy storage and/or generation systems that can more reliably generate a warning signal and/or shutdown at least part of an energy storage and/or generation system upon detection of such ground faults within the energy storage and/or generation system.

SUMMARY

In accordance with the present application, more reliable systems and methods of detecting ground faults in energy storage and/or generation systems that employ direct current (DC)-to-alternating current (AC) power conversion systems are disclosed that can detect ground faults on the DC side and/or the AC side of a DC-to-AC power conversion system, and more reliably generate a warning signal and/or shutdown at least part of the energy storage and/or generation system upon detection of such ground faults within the energy storage and/or generation system. The disclosed systems and methods can monitor levels of DC voltages, as well as amplitudes of AC voltages, occurring on both the positive side and the negative side of a DC bus on the DC side of the DC-to-AC power conversion system, and process the monitored DC voltage levels and AC voltage amplitudes to detect a ground fault within the energy storage and/or generation system. Having detected such a ground fault within the energy storage and/or generation system, the disclosed systems and methods can generate with increased reliability a warning signal and/or shutdown at least part of the energy storage and/or generation system, for example, by disconnecting a DC energy storage and/or generation system from the DC bus, and/or by disabling a DC-to-AC bidirectional inverter included in the DC-to-AC power conversion system.

In one aspect, a system for detecting ground faults in an energy storage and/or generation system that employs a DC-to-AC power conversion system (such a system for detecting ground faults also referred to herein as the "ground fault detection system") includes a measurement/control circuit, a ground fault detector, and a control system for directing the measurement/control circuit to connect or disconnect the DC energy storage and/or generation system from the DC bus, and/or for enabling or disabling the DC-to-AC bidirectional inverter. For example, the DC energy storage and/or generation system can be implemented as an electro-chemical (e.g., battery cell) energy storage system, a capacitive charge energy storage system, a fuel cell energy storage and/or generation system, a photovoltaic energy generation system, or any other suitable DC energy storage and/or generation system. The ground fault detector is connected to both the positive side and the negative side of the DC bus and ground potential. The ground fault detector includes analog conditioning circuitry for monitoring, amplifying, and/or filtering the DC voltage levels and the AC voltage amplitudes occurring on the positive and negative sides of the DC bus with respect to ground potential, and generating DC voltage values that are proportional or correspond to the monitored DC voltage levels and AC voltage amplitudes. The ground fault detector further includes a programmable microprocessor or microcontroller, which receives the DC voltage values generated by the analog conditioning circuitry, and processes the DC voltage values to detect a ground fault within the energy storage and/or generation system. Having detected such a ground fault within the energy storage and/or generation system, the programmable microcontroller provides one or more status signals indicative of the presence and location of the ground fault to the control system, which, based on information provided through the status signals, directs the measurement/control circuit to disconnect the DC energy storage and/or generation system from the DC bus, and/or disables the DC-to-AC bidirectional inverter.

Such an energy storage and/or generation system can be configured for use in an electric power system. In an exemplary aspect, the DC energy storage and/or generation system can include a battery system containing a plurality of battery cells, and one or more power contactors for connecting the plurality of battery cells to the DC bus. The DC bus is disposed between the battery system and the DC-to-AC bidirectional inverter, and an isolation transformer is disposed between the DC-to-AC bidirectional inverter and an AC power grid. The control system is communicably coupled to the measurement/control circuit and the ground fault detector within the ground fault detection system, as well as the DC-to-AC bidirectional inverter within the DC-to-AC power conversion system. The plurality of battery cells can be interconnected within the battery system in series and/or in parallel, and are connectable to the DC bus by the power contactors, which can include one or more semiconductor devices, relays, or any other suitable switching elements. Once the plurality of battery cells are connected to the DC bus by the power contactors, the battery cells can operate to supply DC electric power onto the DC bus. The DC-to-AC bidirectional inverter can convert the DC electric power supplied by the plurality of battery cells into AC electric power, which, in turn, can be supplied through the isolation transformer to the AC power grid.

In one mode of operation, the analog conditioning circuitry included in the ground fault detector can generate (1) a first DC voltage value proportional or corresponding to a level of a DC voltage on the positive side of the DC bus with respect to ground potential, (2) a second DC voltage value proportional or corresponding to an amplitude of an AC voltage on the positive side of the DC bus with respect to ground potential, (3) a third DC voltage value proportional or corresponding to a level of a DC voltage on the negative side of the DC bus with respect to ground potential, and (4) a fourth DC voltage value proportional or corresponding to an amplitude of an AC voltage on the negative side of the DC bus with respect to ground potential. The programmable microcontroller included in the ground fault detector receives the first, second, third, and fourth DC voltage values generated by the analog conditioning circuitry, and processes the respective DC voltage values to detect the presence and location of at least one ground fault within the DC-to-AC power conversion system. In an exemplary aspect, the programmable microcontroller can process the first, second, third, and fourth DC voltage values generated by the analog conditioning circuitry by providing the respective DC voltage values as inputs into at least one algorithm, and executing the algorithm in accordance with one or more sets of parameter values stored in internal or external memory associated with the programmable microcontroller. In a further exemplary aspect, different sets of parameter values can be employed in a case where the battery system is connected to the DC bus, and in a case where the battery system is disconnected from the DC bus. In each case, the respective sets of parameter values can be input by a user for storage in the memory, and can relate to (1) predetermined maximum/minimum DC voltage levels across the DC bus, (2) predetermined maximum/minimum DC voltage levels on the positive side of the DC bus relative to ground potential, (3) predetermined maximum/minimum DC voltage levels on the negative side of the DC bus relative to ground potential, (4) predetermined maximum/minimum AC voltage amplitudes on the positive side of the DC bus relative to ground potential, and (5) predetermined maximum/minimum AC voltage amplitudes on the negative side of the DC bus relative to ground potential.

In a further mode of operation, the analog conditioning circuitry can monitor (1) a level of a first DC voltage on the positive (+DC) side of the DC bus, (2) an amplitude of a first AC voltage on the +DC side of the DC bus, (3) a level of a second DC voltage on the negative (−DC) side of the DC bus, and (4) an amplitude of a second AC voltage on the −DC side of the DC bus. Further, the analog conditioning circuitry can generate (1) a first DC voltage value proportional or corresponding to the level of the first DC voltage on the +DC side of the DC bus with respect to ground potential, (2) a second DC voltage value proportional or corresponding to the amplitude of the first AC voltage on the +DC side of the DC bus with respect to ground potential, (3) a third DC voltage value proportional or corresponding to the level of the second DC voltage on the −DC side of the DC bus with respect to ground potential, and (4) a fourth DC voltage value proportional or corresponding to the amplitude of the second AC voltage on the −DC side of the DC bus with respect to ground potential. The programmable microcontroller can then determine whether the first DC voltage value and the third DC voltage value satisfy at least one condition for a DC ground fault within the DC-to-AC power conversion system, and/or whether the second DC voltage value and the fourth DC voltage value satisfy at least one condition for an AC ground fault within the DC-to-AC power conversion system. Having determined that at least one of the respective conditions for the DC ground fault and/or the AC ground fault is satisfied, the programmable microcontroller can generate at least one output signal indicative of detection of one or more of the DC ground fault and/or the AC ground fault within the energy storage and/or generation system.

By monitoring levels of DC voltages and amplitudes of AC voltages occurring on both the positive side and the negative side of a DC bus on the DC side of a DC-to-AC power conversion system within an energy storage and/or generation system, and processing DC voltage values proportional or corresponding to the monitored DC voltage levels and AC voltage amplitudes, such as by inputting the respective DC voltage values into at least one algorithm and executing the algorithm in accordance with one or more sets of parameter values, the presence and location of a ground fault can be advantageously detected, not only on the DC side, but also on the AC side of the DC-to-AC power conversion system.

Other features, functions, and aspects of the invention will be evident from the Detailed Description that follows.

BRIEF DESCRIPTION OF THE DRAWINGS

The accompanying drawings, which are incorporated in and constitute a part of this specification, illustrate one or more embodiments described herein and, together with the Detailed Description, explain these embodiments. In the drawings:

FIG. 4b is a diagram illustrating exemplary voltage and timing values associated with the detection of the DC ground fault at the approximate midpoint of the plurality of connected battery cells of FIG. 4a.

DETAILED DESCRIPTION

More reliable systems and methods of detecting ground faults in energy storage and/or generation systems that employ direct current (DC)-to-alternating current (AC) power conversion systems are disclosed that can detect ground faults on the DC side and/or the AC side of a DC-to-AC power conversion system, and more reliably generate a warning signal and/or shutdown at least part of the energy storage and/or generation system upon detection of such ground faults within the energy storage and/or generation system. The disclosed systems and methods can monitor levels of DC voltages and amplitudes of AC voltages occurring on both the positive side and the negative side of a DC bus on the DC side of the DC-to-AC power conversion system, and process the monitored DC voltage levels and AC voltage amplitudes to detect a ground fault within the energy storage and/or generation system. Having detected such a ground fault within the energy storage and/or generation system, the disclosed systems and methods can generate with increased reliability a warning signal, and/or shutdown at least part of the energy storage and/or generation system, for example, by disconnecting a DC energy storage and/or generation system from the DC bus, and/or by disabling a DC-to-AC bidirectional inverter included in the DC-to-AC power conversion system.

Figure 1:
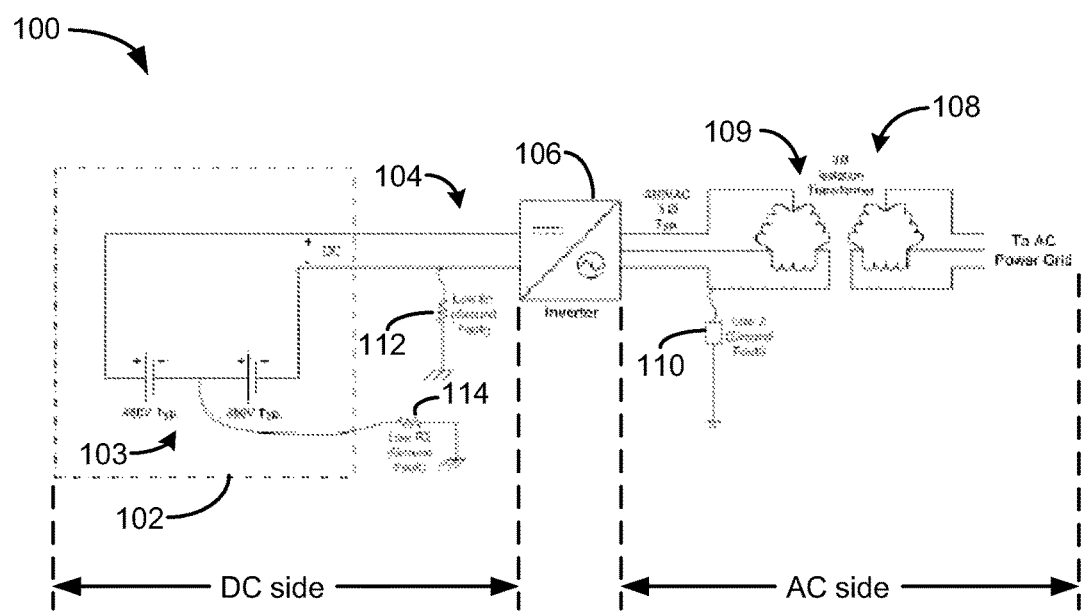
FIG. 1 is a schematic diagram of a typical energy storage and/or generation system employing a direct current (DC)-to-alternating current (AC) power conversion system.

FIG. 1 depicts a typical energy storage and/or generation system 100 that includes a DC energy storage and/or generation system such as a battery system 102 containing a plurality of battery cells 103, a DC bus 104, a DC-to-AC bidirectional inverter 106, and an isolation transformer 108, which has a winding 109. The DC bus 104 is disposed between the battery system 102 and the DC-to-AC bidirectional inverter 106, and the isolation transformer 108, 109 is disposed between the DC-to-AC bidirectional inverter 106 and an AC power grid. The plurality of battery cells 103 can be interconnected within the battery system 102 in series and/or in parallel. For example, the plurality of battery cells can include rechargeable battery cells such as nickel-cadmium battery cells, nickel-metal-hydride battery cells, lithium-ion battery cells, etc. Further, once adequately charged, the respective battery cells 103 can provide a DC voltage level that may be suitable to provide power to a connected DC-to-AC bidirectional inverter (such as the DC-to-AC bidirectional inverter 106) or other load. In a typical mode of operation, the plurality of battery cells 103 are connected to the DC bus 104, and operate to supply DC electric power onto the DC bus 104. The DC-to-AC bidirectional inverter 106 converts the DC electric power supplied by the plurality of battery cells 103 into AC electric power at, for example, 480 volts AC, 3 phase, which, in turn, is supplied through the isolation transformer 108, 109 to the AC power grid.

In the energy storage and/or generation system 100 of FIG. 1, the DC-to-AC bidirectional inverter 106 typically employs a high frequency (e.g., 5 kHz or higher) waveform synthesizer (not shown), requiring the AC side (see FIG. 1) of the DC-to-AC power conversion system to be isolated from ground potential. Failure to isolate the AC side of the DC-to-AC power conversion system from ground potential can cause a high frequency AC signal (e.g., 5 kHz or higher) to be impressed on the DC side (see FIG. 1) of the DC-to-AC bidirectional inverter 106 with respect to ground potential, possibly damaging electrical components connected between the DC bus and ground, and/or coupling into noise-sensitive monitoring, control, and/or communication circuits. Such a failure in maintaining proper isolation of the AC side of the DC-to-AC power conversion system from ground potential can result from a ground fault caused by a low resistance or low impedance path 110 from the AC side of the DC-to-AC power conversion system to ground.

Moreover, safety concerns dictate that the DC side of the DC-to-AC power conversion system also be isolated from ground potential. If one side (positive or negative) of the DC bus 104 were inadvertently or deliberately connected to ground potential, then a ground fault occurring on the other side (negative or positive) of the DC bus 104 might result in a dangerously high current condition. In this case, such a ground fault can be caused by a low resistance path 112 from the positive or negative side of the DC bus 104 to ground, or a low resistance path 114 occurring between an approximate midpoint of the connected battery cells 103 and ground.

Figure 2:
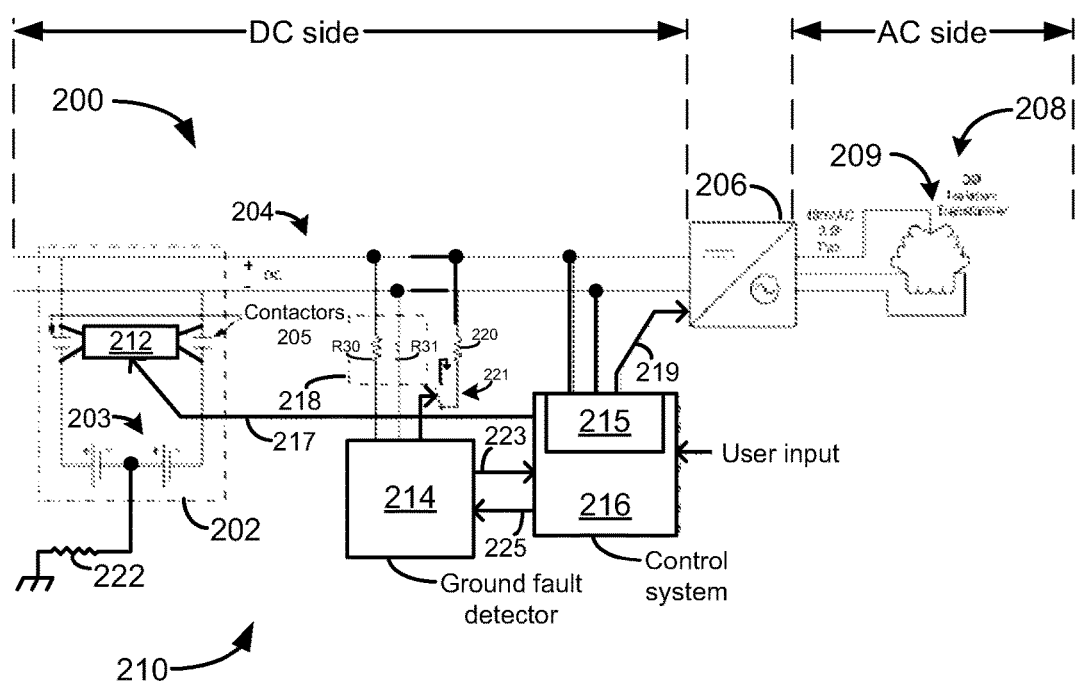
FIG. 2 is a schematic diagram of an exemplary system for detecting ground faults in an energy storage and/or generation system, in accordance with the present application.

FIG. 2 depicts an illustrative embodiment of an exemplary system 210 for detecting ground faults in an energy storage and/or generation system 200, in accordance with the present application. As shown in FIG. 2, the system 210 for detecting ground faults (also referred to herein as the "ground fault detection system") includes measurement/control circuitry 212, a ground fault detector 214, and a control system 216 for directing the measurement/control circuitry 212 to connect or disconnect at least one DC energy storage and/or generation system (such as a battery system 202) from a DC bus 204, and/or for enabling or disabling a DC-to-AC bidirectional inverter 206 included in a DC-to-AC power conversion system. For example, such a DC energy storage and/or generation system can be implemented as an electro-chemical (e.g., battery cell) energy storage system, a capacitive charge energy storage system, a fuel cell energy storage and/or generation system, a photovoltaic energy generation system, or any other suitable DC energy storage and/or generation system.

The ground fault detector 214 is connected to both the positive side and the negative side of the DC bus 204 through an isolation network 218 consisting of high voltage and high value resistors R30, R31 (see FIG. 2). The ground fault detector 214 includes analog conditioning circuitry 302 (see FIG. 3) for monitoring, amplifying, and/or filtering DC voltage levels and AC voltage amplitudes occurring on the positive and negative sides of the DC bus 204 with respect to ground potential, and generating DC voltage values that are proportional or correspond to the monitored DC voltage levels and AC voltage amplitudes. The ground fault detector 214 further includes a programmable microprocessor or microcontroller 304 (see FIG. 3), which receives the DC voltage values generated by the analog conditioning circuitry 302, and processes the DC voltage values to detect a ground fault within the energy storage and/or generation system 200. Having detected such a ground fault within the energy storage and/or generation system 200, the programmable microcontroller 304 provides, at one or more of its digital outputs D02, D03, D04, one or more status signals over at least one signal line 223 to indicate or warn of the presence and/or location of a ground fault (e.g., DC ground fault, AC ground fault; see FIG. 3) and/or a malfunction (e.g., an invalid condition on the DC bus 204) to the control system 216, which, based on information provided by the status signals, can direct the measurement/control circuitry 212, over a signal line 217, to disconnect a plurality of battery cells 203 within the battery system 202 from the DC bus 204, and/or provide a control signal, over a control line 219, to disable the DC-to-AC bidirectional inverter 206 within the DC-to-AC power conversion system.

It is noted that the energy storage and/or generation system 200 of FIG. 2 can be configured for use in an electric power system. For example, the energy storage and/or generation system 200 can include the battery system 202 containing the plurality of battery cells 203 and one or more power contactors 205, the DC bus 204, the DC-to-AC bidirectional inverter 206, and an isolation transformer 208, which has an isolated winding 209. As shown in FIG. 2, the DC bus 204 is disposed between the battery system 202 and the DC-to-AC bidirectional inverter 206, and the isolation transformer 208, 209 is disposed between the DC-to-AC bidirectional inverter 206 and an AC power grid. The control system 216 is communicably coupled to (1) the measurement/control circuitry 212 by the signal line 217, (2) the ground fault detector 214 by the signal line 223 and a signal line 225, and (3) the DC-to-AC bidirectional inverter 206 by the control line 219. The plurality of battery cells 203 can be interconnected within the battery system 202 in series and/or in parallel, and are connectable to the DC bus 204 by the power contactors 205, which can include one or more semiconductor devices, relays, or any other suitable switching elements. Once the plurality of battery cells 203 are connected to the DC bus 204 by the power contactors 205, the battery cells 203 can operate to supply DC electric power onto the DC bus 204. The DC-to-AC bidirectional inverter 206 can convert the DC electric power supplied by the plurality of battery cells 203 into AC electric power at, for example, 480 volts AC, 3 phase, which, in turn, can be supplied through the isolation transformer 208, 209 to the AC power grid.

Figure 3:
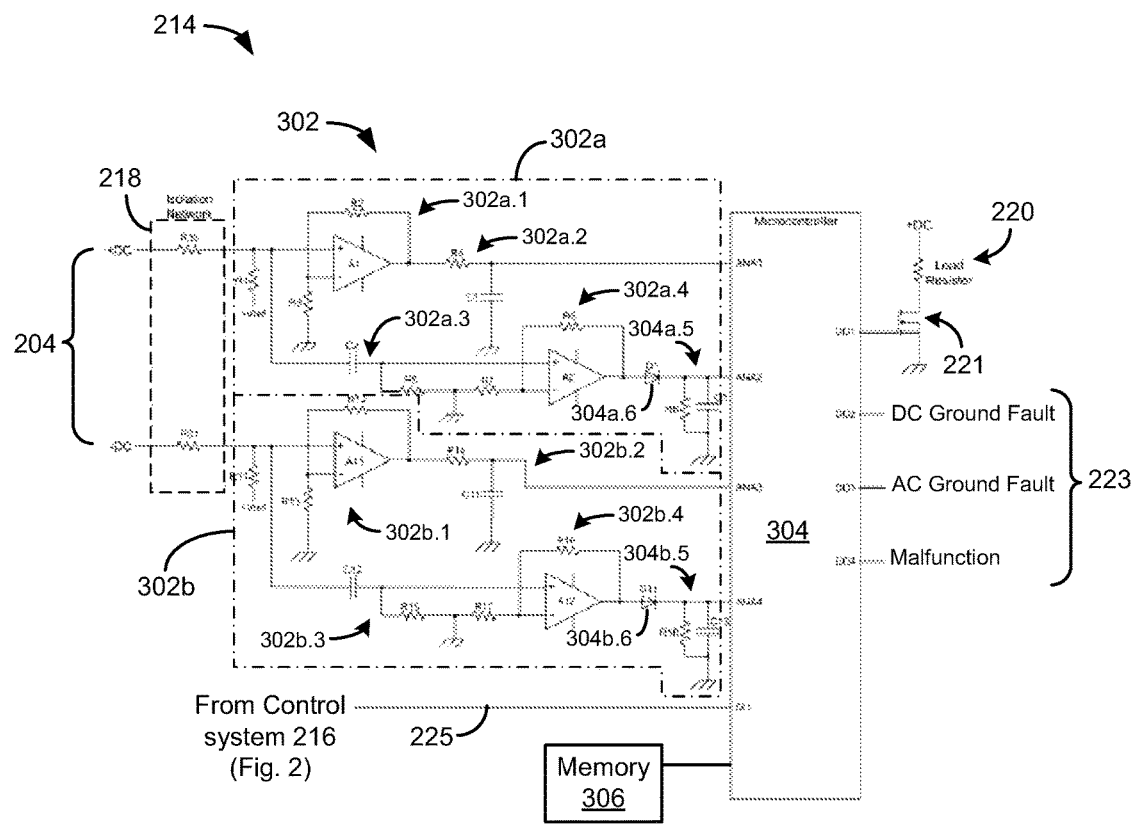
FIG. 3 is a schematic diagram of a ground fault detector included in the system for detecting ground faults of FIG. 2.

FIG. 3 depicts a schematic diagram of the ground fault detector 214 included in the ground fault detection system 210 of FIG. 2. As shown in FIG. 3, the ground fault detector 214 includes the analog conditioning circuitry 302 and the programmable microcontroller 304. The analog conditioning circuitry 302 includes a first analog conditioning circuit 302a for monitoring, amplifying, and/or filtering DC voltage levels and AC voltage amplitudes occurring on the positive (+DC) side of the DC bus 204 with respect to ground potential, and generating DC voltage values that are proportional or correspond to the monitored DC voltage levels and AC voltage amplitudes. The analog conditioning circuitry 302 further includes a second analog conditioning circuit 302b for monitoring, amplifying, and/or filtering DC voltage levels and AC voltage amplitudes occurring on the negative (−DC) side of the DC bus 204 with respect to ground potential, and generating DC voltage values that are proportional or correspond to the monitored DC voltage levels and AC voltage amplitudes.

More specifically, the analog conditioning circuit 302a monitors the DC voltage levels and AC voltage amplitudes occurring on the +DC side of the DC bus 204 through the resistor R30 included in the isolation network 218. Likewise, the analog conditioning circuit 302b monitors the DC voltage levels and AC voltage amplitudes occurring on the −DC side of the DC bus 204 through the resistor R31 included in the isolation network 218. The resistor R30 and the resistor R31 can reduce relatively high DC voltage levels on the +DC side and the −DC side, respectively, of the DC bus 204 down to several volts DC, allowing the analog conditioning circuitry 302 and the programmable microcontroller 304 to be implemented using standard off-the-shelf components that operate at reduced DC voltage levels (e.g., 5 volts DC). For example, the resistors R30, R31 within the isolation network 218 can each have a resistance value of at least 500,000 ohms, or any other suitable value.

Within the analog conditioning circuit 302a (see FIG. 3), the DC voltage on the +DC side of the DC bus 204 with respect to ground potential is amplified by an operational amplifier circuit 302a.1 including an operational amplifier A1 and resistors R2, R3, and filtered by a low-pass filter circuit 302a.2 including a resistor R4 and a capacitor C1. The analog conditioning circuit 302a includes an additional resistor R1 connected between a positive (non-inverting) input of the operational amplifier A1 and a standard reference voltage level (+Vref), such as 2.5 volts or any other suitable voltage level. The resistor R1 in conjunction with the resistor R30 form a voltage divider that reduces the relatively high DC voltage level on the +DC side of the DC bus 204 down to several volts DC, as described hereinbefore. In one embodiment, the ratio of resistance values of the resistors R1 and R30 can be such that, for a DC voltage of about +/−1,200 volts DC on the +DC side of the DC bus 204, the reduced DC voltage across the resistor R1 is about +/−2 volts DC. It is noted that the voltage on the +DC side of the DC bus 204 can be positive or negative relative to ground potential. The DC voltage across the resistor R1 is amplified by the operational amplifier circuit 302a.1 with a gain of (R2+R3)/R3, and filtered by the low-pass filter circuit 302a.2 to reject any AC component in the amplified DC voltage, thereby generating, at a first analog input (ANA1) of the programmable microcontroller 304, a DC voltage value that is proportional or corresponds to the DC voltage level on the +DC side of the DC bus 204 relative to ground potential.

With further regard to the analog conditioning circuit 302a (see FIG. 3), the AC voltage on the +DC side of the DC bus 204 is filtered by a high-pass filter circuit 302a.3 including a capacitor C2 and a resistor R5, amplified by an operational amplifier circuit 302a.4 including an operational amplifier A2 and resistors R6, R7, and rectified and filtered by a rectifier/filter circuit 304a.5, 304a.6 including a diode D1, a resistor R8, and a capacitor C3. In the high-pass filter circuit 302a.3, the values of the capacitor C2 and the resistor R5 can be chosen such that attenuation of the AC voltage is small at the lowest expected frequency (e.g., 50 or 60 Hz) of the AC voltage on the +DC side of the DC bus 204. The AC voltage across the resistor R1 is filtered by the high-pass filter circuit 302a.3, amplified by the operational amplifier circuit 302a.4 with a gain of (R6+R7)/R7, and rectified/filtered by the rectifier/filter circuit 304a.5, 304a.6, thereby generating, at a second analog input (ANA2) of the programmable microcontroller 304, a DC voltage value that is proportional or corresponds to the AC voltage amplitude on the +DC side of the DC bus 204 relative to ground potential.

Likewise, within the analog conditioning circuit 302b (see FIG. 3), the DC voltage on the −DC side of the DC bus 204 with respect to ground potential is amplified by an operational amplifier circuit 302b.1 including an operational amplifier A11 and resistors R12, R13, and filtered by a low-pass filter circuit 302b.2 including a resistor R14 and a capacitor C11. The analog conditioning circuit 302b includes an additional resistor R11 connected between a positive (non-inverting) input of the operational amplifier A11 and the predetermined reference voltage level (+Vref). The resistor R11 in conjunction with the resistor R31 form a voltage divider that reduces the relatively high DC voltage level on the −DC side of the DC bus 204 down to several volts DC, as described hereinbefore. In one embodiment, the ratio of resistance values of the resistors R11 and R31 can be such that, for a DC voltage of about +/−1,200 volts DC on the −DC side of the DC bus 204, the reduced DC voltage across the resistor R11 is about +/−2 volts DC. It is noted that, like the voltage on the +DC side of the DC bus 204, the voltage on the −DC side of the DC bus 204 can be positive or negative relative to ground potential. The DC voltage across the resistor R11 is amplified by the operational amplifier circuit 302b.1 with a gain of (R12+R13)/R13, and filtered by the low-pass filter circuit 302b.2 to reject any AC component in the amplified DC voltage, thereby generating, at a third analog input (ANA3) of the programmable microcontroller 304, a DC voltage value that is proportional or corresponds to the DC voltage level on the −DC side of the DC bus 204 relative to ground potential.

With further regard to the analog conditioning circuit 302b (see FIG. 3), the AC voltage on the −DC side of the DC bus 204 is filtered by a high-pass filter circuit 302b.3 including a capacitor C12 and a resistor R15, amplified by an operational amplifier circuit 302b.4 including an operational amplifier A12 and resistors R16, R17, and rectified and filtered by a rectifier/filter circuit 304b.5, 304b.6 including a diode D11, a resistor R18, and a capacitor C13. As in the high-pass filter circuit 302a.3, the values of the capacitor C12 and the resistor R15 included in the high-pass filter circuit 302b.3 can be chosen such that attenuation of the AC voltage is small at the lowest expected frequency (e.g., 50 or 60 Hz) of the AC voltage on the −DC side of the DC bus 204. The AC voltage across the resistor R11 is filtered by the high-pass filter circuit 302b.3, amplified by the operational amplifier circuit 302b.4 with a gain of (R16+R17)/R17, and rectified/filtered by the rectifier/filter circuit 304b.5, 304b.6, thereby generating, at a fourth analog input (ANA4) of the programmable microcontroller 304, a DC voltage value that is proportional or corresponds to the AC voltage amplitude on the −DC side of the DC bus 204 relative to ground potential.

As described herein, the programmable microcontroller 304 (see FIG. 3) receives, at its first, second, third, and fourth analog inputs (ANA1, ANA2, ANA3, ANA4), the DC voltage values generated by the analog conditioning circuitry 302, and processes the DC voltage values to detect a DC or AC ground fault within the energy storage and/or generation system 200. To allow the programmable microcontroller 304 to monitor a voltage level between the +DC or −DC side of the DC bus 204 and ground potential, and to detect a DC ground fault in the vicinity of the midpoint of the plurality of connected battery cells 203 based on the monitored voltage level, the ground fault detector 214 further includes a switch 221 such as a semiconductor device or any other suitable switching element, and a load resistor 220 connected between the +DC side of the DC bus 204 and the switch 221. For example, such a DC ground fault located at or near the midpoint of the plurality of connected battery cells 203 can be caused by a low resistance path 222 (see FIG. 2) occurring between a node at the approximate midpoint of the connected battery cells 203 and ground. The programmable microcontroller 304 can provide, at its digital output DO1, a control signal to a control input of the switch 221 to connect the load resistor 220 to ground potential for a relatively brief time period, such as 0.2 seconds or any other suitable time period, repetitively or periodically every few seconds, such as every 2 seconds or any other suitable time. For example, the duty cycle of such a relatively brief time period can be less than 5%, resulting in power dissipation in the load resistor 220 that is less than 1 watt. In one embodiment, the load resistor 220 can have a value of 50,000 ohms to create a measurable voltage shift on the DC bus 204 when an overall leakage to ground potential is greater than about 2,000 ohms.

Such detection of a DC ground fault in the vicinity of the midpoint of the plurality of connected battery cells 203 will be further understood with reference to the following illustrative example, and FIGS. 2-4b. In this example, "+DC" (see FIGS. 4a and 4b) corresponds to the DC voltage level on the +DC side of the DC bus 204 (see FIGS. 2 and 4a) relative to ground potential, "−DC" (see FIGS. 4a and 4b) corresponds to the DC voltage level on the −DC side of the DC bus 204 (see FIGS. 2 and 4a) relative to ground potential, and "Ctrl" (see FIGS. 4a and 4b) corresponds to the control signal provided by the programmable microcontroller 304 (see FIG. 3) to the control input of the switch 221 (see FIGS. 2-4a). The plurality of battery cells 203 (see FIG. 2) are connected to the DC bus 204 by the power contactors 205 (see FIG. 2) to supply DC electric power onto the DC bus 204, resulting in the DC voltage levels +DC and −DC being equal to "V1" and "V2" (see FIGS. 4a, 4b), respectively, relative to ground potential. In this example, the low resistance path 222 (see FIG. 2) causing the DC ground fault at or near the midpoint of the plurality of connected battery cells 203 is respresented by a 1,000 ohm resistance to ground, and the connected battery cells 203 are configured to function as a 900 volt DC battery.

Figure 4A:
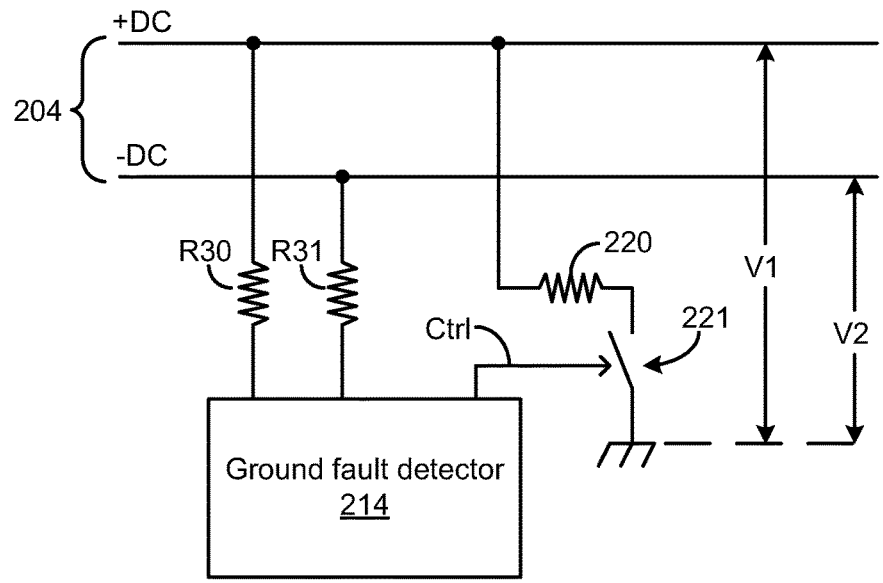
FIG. 4a is a schematic diagram of the ground fault detector of FIG. 3 configured for use in detecting a DC ground fault at an approximate midpoint of a plurality of connected battery cells included in the energy storage and/or generation system of FIG. 2.
Figure 4B:
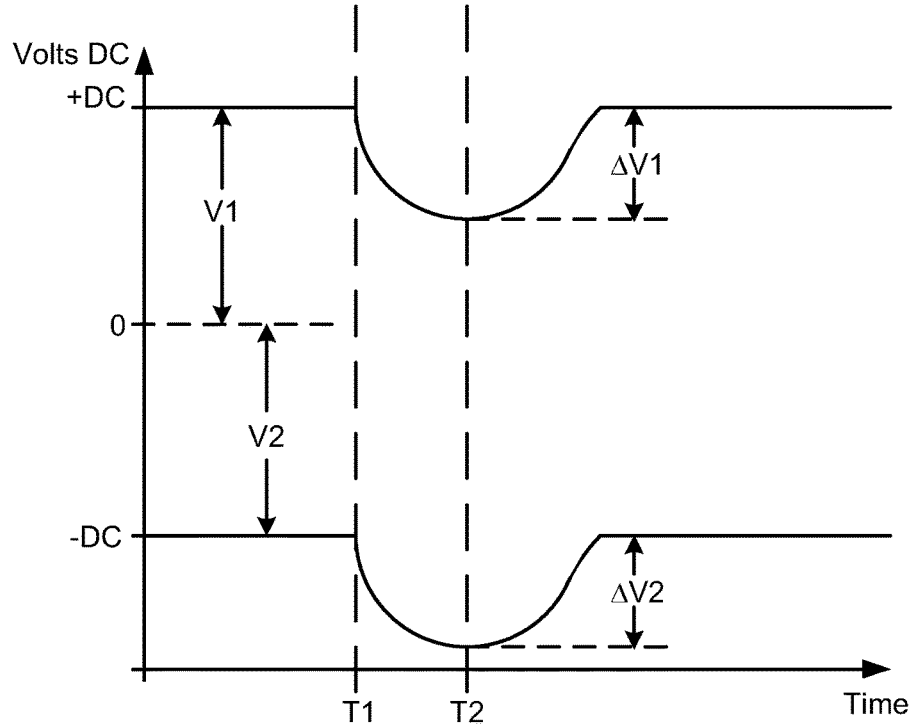

As shown in FIGS. 3-4b, the programmable microcontroller 304 (see FIG. 3) can assert the control signal, Ctrl, for a brief time period (e.g., 0.2 seconds) corresponding to the difference between a time "$T_2$" (see FIG. 4b) and a time "$T_1$" (see FIG. 4b), thereby connecting the load resistor 220 to ground potential for the duration of the brief time period, i.e., $T_2$-$T_1$. In response to the load resistor 220 (e.g., 50,000 ohms) being connected to ground potential during the time period, $T_2$-$T_1$, the voltage level, +DC, momentarily shifts in the negative direction, causing, from time $T_1$ to time $T_2$, a change, $\Delta V_1$ (see FIG. 4b), in the DC voltage level on the +DC side of the DC bus 204. Likewise, the voltage level, −DC, momentarily shifts in the negative direction, causing, from time $T_1$ to time $T_2$, a corresponding change, $\Delta V_2$ (see FIG. 4b), in the DC voltage level on the −DC side of the DC bus 204.

The analog conditioning circuit 302a (see FIG. 3) can monitor the change $\Delta V_1$ in the DC voltage level on the +DC side of the DC bus 204, and generate, at the first analog input (ANA1) of the programmable microcontroller 304, a DC voltage value that corresponds to the monitored change $\Delta V_1$. Likewise, the analog conditioning circuit 302b (see FIG. 3) can monitor the change $\Delta V_2$ in the DC voltage level on the −DC side of the DC bus 204, and generate, at the third analog input (ANA3) of the programmable microcontroller 304, a DC voltage value that corresponds to the monitored change $\Delta V_2$. If the programmable microcontroller 304 determines that the change $\Delta V_1$ or $\Delta V_2$ in the DC voltage level on either the +DC side or the −DC side of the DC bus 204 is less than a predetermined voltage level, such as 5 volts DC or any other suitable voltage level, then the programmable microcontroller 304 can provide, to the control system 216 over the signal line 223, an indication of a DC ground fault condition at or near the midpoint of the plurality of connected battery cells 203.

In this example, if a DC ground fault (e.g., 1,000 ohm resistance to ground) occurs at the approximate midpoint of the 900 volt DC battery (as represented by the plurality of connected battery cells 203), then the change in voltage $\Delta V_1$ or $\Delta V_2$ (see FIG. 4b) due to momentarily connecting the load resistor 220 (e.g., 50,000 ohms) to ground is expected to be about 5 volts DC. The programmable microcontroller 304 can employ such a voltage level, e.g., 5 volts DC, as a threshold voltage level for indicating a DC ground fault in the vicinity of the midpoint of the connected battery cells 203. In one embodiment, the programmable microcontroller 304 can be configured to take one or more measurements of the change in voltage $\Delta V_1$ or $\Delta V_2$ (see FIG. 4b) during the time period $T_2$-$T_1$ (see FIG. 4b) while the load resistor 220 is connected to ground. If the programmable microcontroller 304 determines that none of the respective measurements is greater than the threshold voltage level of 5 volts DC, then the programmable microcontroller 304 can provide, at its digital output DO2 (see FIG. 3), an indication of the presence of the DC ground fault in the vicinity of the midpoint of the connected battery cells 203. Otherwise, if the respective measurements of the change in voltage $\Delta V_1$ or $\Delta V_2$ during the time period $T_2$-$T_1$ are each determined to be above the 5 volt DC threshold voltage level, then no DC ground fault would be indicated.

In an exemplary mode of operation, the programmable microcontroller 304 can process the DC voltage values at its analog inputs (ANA1, ANA2, ANA3, ANA4) by providing the respective DC voltage values as inputs into at least one algorithm, and executing the algorithm in accordance with one or more sets of parameter values stored in internal or external memory 306 (see FIG. 3) associated with the programmable microcontroller 304. In one embodiment, different sets of parameter values can be employed in a case where the plurality of battery cells 203 are connected to the DC bus 204, and in a case where the plurality of battery cells 203 are disconnected from the DC bus 204. In each case, the respective sets of parameter values can be input by a user, and pertain to (1) predetermined maximum/minimum DC voltage levels across the DC bus 204, (2) predetermined maximum/minimum DC voltage levels on the +DC side of the DC bus 204 relative to ground potential, (3) predetermined maximum/minimum DC voltage levels on the −DC side of the DC bus 204 relative to ground potential, (4) predetermined maximum/minimum AC voltage amplitudes on the +DC side of the DC bus 204 relative to ground potential, and (5) predetermined maximum/minimum AC voltage amplitudes on the −DC side of the DC bus 204 relative to ground potential.

By monitoring the levels of DC voltages and the amplitudes of AC voltages occurring on both the +DC side and the −DC side of the DC bus 204 on the DC side of the DC-to-AC power conversion system within the energy storage and/or generation system 200, and processing DC voltage values proportional or corresponding to the monitored DC voltage levels and AC voltage amplitudes, such as by inputting the respective DC voltage values into at least one algorithm and executing the algorithm in accordance with one or more sets of parameter values, the ground fault detection system 210 can advantageously detect the presence and location of ground faults, not only on the DC side, but also on the AC side of the DC-to-AC power conversion system.

The operation of the ground fault detection system 210 (see FIG. 2) will be further understood with reference to the following additional illustrative example. In this example, the programmable microcontroller 304 (see FIG. 3) within the ground fault detector 214 executes an algorithm in accordance with different sets of parameter values in the case where the plurality of battery cells 203 are connected to the DC bus 204, and in the case where the plurality of battery cells 203 are disconnected from the DC bus 204.

It is noted that, in the case where the plurality of battery cells 203 are connected to the DC bus 204, high impedance circuitry, such as high impedance measurement circuitry 215 (see FIG. 2) included in the control system 216, high impedance measurement circuitry included in the measurement/control circuitry 212, and/or the high impedance analog conditioning circuitry 302 included in the ground fault detector 214, do not typically substantially affect the voltages on the DC bus 204. However, in the case where the plurality of battery cells 203 are disconnected from the DC bus 204, such high impedance circuitry can have an effect on the voltages on the DC bus 204. In this example, the set of parameter values for the case where the plurality of battery cells 203 are disconnected from the DC bus 204 are therefore chosen to assume a negative bias in such high impedance circuitry. Such parameter values for the case where the plurality of battery cells 203 are disconnected from the DC bus 204 can alternatively be chosen to assume a positive bias in such high impedance circuitry. The user can calculate the different sets of parameter values based at least on measurements of DC voltage levels and/or AC voltage amplitudes occurring on the DC bus 204 for selected values of DC resistance between the +DC and −DC sides of the DC bus 204 relative to ground potential. In this example, exemplary DC resistance values are selected to be between 1,000 ohms and 5,000 ohms, and the effects of such DC resistance values on the measured DC voltage levels and/or AC voltage amplitudes are used to determine trigger points for the detection of DC and/or AC ground faults within the energy storage and/or generation system 200.

A first exemplary set of parameter values corresponding to DC voltage levels on the DC bus 204 for the case where the plurality of battery cells 203 are connected to the DC bus 204 is provided in TABLE I below.

TABLE I

| | | |
|---|---|---|
| DC voltage level across DC bus 204 | +750 volts DC minimum | +1,000 volts DC maximum |
| DC voltage level on +DC side of DC bus 204 relative to ground potential | +300 volts DC minimum | +700 volts DC maximum |
| DC voltage level on −DC side of DC bus 204 relative to ground potential | −700 volts DC minimum | −300 volts DC maximum |

A second exemplary set of parameter values corresponding to DC voltage levels on the DC bus 204 for the case where the plurality of battery cells 203 are disconnected from the DC bus 204 is provided in TABLE II below.

TABLE II

| DC voltage level across DC bus 204 | 0 volts DC minimum | +200 volts DC maximum |
|---|---|---|
| DC voltage level on +DC side of DC bus 204 relative to ground potential | −200 volts DC minimum | 0 volts DC maximum |
| DC voltage level on −DC side of DC bus 204 relative to ground potential | −200 volts DC minimum | 0 volts DC maximum |

A third exemplary set of parameter values corresponding to AC voltage amplitudes on the DC bus 204 applicable to the case where the plurality of battery cells 203 are connected to the DC bus 204, as well as the case where the plurality of battery cells 203 are disconnected from the DC bus 204, is provided in TABLE III below. In TABLE III, exemplary minimum and maximum AC voltage amplitudes peak-to-peak (p-p) are provided that would be expected (1) to have "no effect" on the energy storage and/or generation system 200, (2) to result in electrical "noise" coupled into any monitoring, control, and/or communication circuits within the energy storage and/or generation system 200, and (3) to cause a "potential hazard" condition within the energy storage and/or generation system 200.

TABLE III

| AC voltage amplitude on +DC side or −DC side of DC bus 204 relative to ground potential - no effect | 0 volts p-p minimum | 100 volts p-p maximum |
|---|---|---|
| AC voltage amplitude on +DC side or −DC side of DC bus 204 relative to ground potential - noise | 100 volts p-p minimum | 400 volts p-p maximum |
| AC voltage amplitude on +DC side or −DC side of DC bus 204 relative to ground potential - potential hazard | 400 volts p-p or more | |

In this example, the programmable microcontroller 304 within the ground fault detector 214 can provide the DC voltage values at its analog inputs (ANA1, ANA2, ANA3, ANA4) as inputs into an exemplary algorithm, as outlined below, and subsequently execute the exemplary algorithm in accordance with the exemplary sets of parameter values provided hereinbefore in TABLES I, II, and III.

If $((+DC)-(-DC)) \geq 500$ volts $DC$ $$DC\ GF = (|+DC|<100\ \text{volts}\ DC) \| (|-DC|<100\ \text{volts}\ DC) \quad (1)$$

If $(((+DC)-(-DC))<500\ \text{volts}\ DC)\ \&\&\ (((+DC)-(-DC)) \geq 20\ \text{volts}\ DC)$ $$DC\ GF = (|+DC|<5\ \text{volts}\ DC) \| (|-DC|<5\ \text{volts}\ DC) \quad (2)$$

If $((+DC)-(-DC)) \leq 20$ volts $DC$ $$DC\ GF = 0 \quad (3)$$

$$AC\ GF\ (\text{major}) = ((+AC)>400\ \text{volts}\ p\text{-}p) \| ((-AC)>400\ \text{volts}\ p\text{-}p) \quad (4)$$

$$AC\ GF\ (\text{minor}) = ((+AC)>100\ \text{volts}\ p\text{-}p) \| ((-AC)>100\ \text{volts}\ p\text{-}p) \quad (5)$$

In the exemplary algorithm outlined above, "+DC" corresponds to the DC voltage level on the +DC side of the DC bus 204 relative to ground potential, "−DC" corresponds to the DC voltage level on the −DC side of the DC bus 204 relative to ground potential, "+AC" corresponds to the AC voltage amplitude on the +DC side of the DC bus 204 relative to ground potential, and "−AC" corresponds to the AC voltage amplitude on the −DC side of the DC bus 204 relative to ground potential. Further, "DC GF", "AC GF (major)", and "AC GF (minor)" are each representative of a condition under which one or more of the status signals (i.e., DC ground fault, AC ground fault; see FIG. 3) can be asserted by the programmable microcontroller 304 to indicate the presence and location of a DC or AC ground fault within the energy storage and/or generation system 200.

Specifically, "DC GF" represents the conditions under which a DC ground fault can be caused by a low resistance path from the +DC side or −DC side of the DC bus 204 to ground. For example, if the difference between +DC and −DC is greater than or equal to 500 volts DC, then the condition where the magnitude of either +DC or −DC is less than 100 volts DC can be indicative of a DC ground fault (DC GF; see equation (1)). Further, if the difference between +DC and −DC is greater than or equal to 20 volts DC, but less than 500 volts DC, then the condition where the magnitude of either +DC or −DC is less than 5 volts DC can be indicative of a DC ground fault (DC GF; see equation (2)). Moreover, if the difference between +DC and −DC is less than or equal to 20 volts DC, then a hazard condition due to a ground fault caused by a low resistance path to ground is not likely to exist because such a relatively low voltage across the DC bus 204 would not typically allow dangerous energy dissipation to occur from such a low resistance path. In a situation where the difference between +DC and −DC is equal to 0 volts DC, no DC ground fault can exist (DC GF; see equation (3)).

In addition, "AC GF (major)" represents the condition of a major AC ground fault caused by a low resistance or low impedance path from any winding (such as the winding 209) of the isolation transformer 208 to ground, causing an AC voltage with a potentially hazardous amplitude to be impressed on the +DC side or −DC side of the DC bus 204 with respect to ground potential. For example, the condition where either +AC or −AC is greater than 400 volts p-p can be indicative of a major AC ground fault (AC GF (major); see equation (4)). Further, "AC GF (minor)" represents the condition of a minor AC ground fault caused by a low resistance or low impedance path from any winding (such as the winding 209) of the isolation transformer 208 to ground, causing an AC voltage with an amplitude likely to result in electrical "noise" coupled into any monitoring, control, and/or communication circuits within the energy storage and/or generation system 200 to be impressed on the +DC side or −DC side of the DC bus 204 with respect to ground potential. For example, the condition where either +AC or −AC is greater than 100 volts p-p can be indicative of a minor AC ground fault (AC GF (minor); see equation (5)).

In this example, the exemplary algorithm outlined above can include an additional condition under which one of the status signals (i.e., Malfunction; see FIG. 3) can be asserted by the programmable microcontroller 304 to indicate an unexpected or invalid condition on the DC bus 204. For example, if the magnitude of the DC voltage level between the −DC side or the +DC side of the DC bus 204 and ground potential is normally less than 1,000 volts DC, but a subsequent measurement of the magnitude of −DC or +DC with respect to ground potential is greater than 1,200 volts DC, then a status signal indicating the presence of a malfunction or other invalid condition on the DC bus 204 can be provided at the digital output DO4 of the programmable microcontroller 304. The additional condition of the exemplary algorithm can therefore be expressed, as follows:

$$\text{Malfunction} = (|-DC|>1,200\ \text{volts}\ DC) \| ((|+DC|)>1,200\ \text{volts}\ DC) \quad (6)$$

in which "|−DC|" corresponds to the magnitude of the DC voltage level on the −DC side of the DC bus 204 relative to ground potential, and "|+DC|" corresponds to the magnitude of the DC voltage level on the +DC side of the DC bus 204 relative to ground potential. Accordingly, the condition where the measured magnitude of −DC or +DC with respect to ground potential is greater than 1,200 volts DC, or any other suitable voltage magnitude, can be indicative of a malfunction or invalid condition on the DC bus 204.

Having executed the exemplary algorithm outlined above in accordance with the exemplary sets of parameter values provided herein, the programmable microcontroller 304 provides, at one or more of its digital outputs D02, D03, D04, one or more of the status signals over the signal line 223 to indicate or warn of the presence and location of a ground fault (i.e., DC ground fault, AC ground fault; see FIG. 3) and/or a malfunction (such as an invalid condition on the DC bus 204) to the control system 216. With regard to the exemplary algorithm, if the condition under which a status signal was asserted is represented by "DC GF" (see equations (1), (2), and (3) above) or "AC GF (major)" (see equation (4) above), then the control system 216 can direct the measurement/control circuitry 212, over the signal line 217, to disconnect the plurality of battery cells 203 from the DC bus 204, and/or provide a control signal, over the control line 219, to disable the DC-to-AC bidirectional inverter 206, resulting in at least a partial shutdown of the energy storage and/or generation system 200.

Figure 5A:
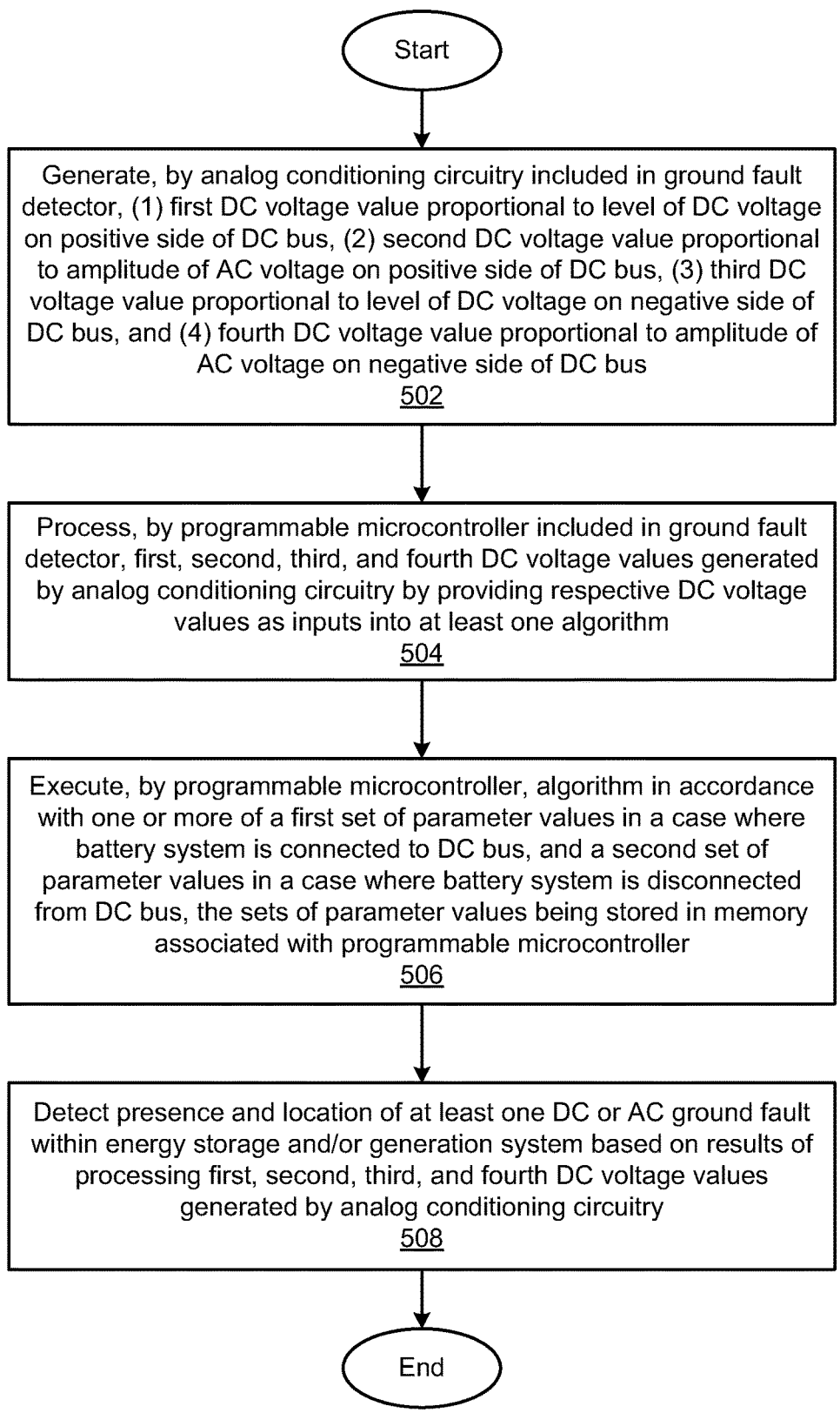
FIGS. 5a and 5b are flow diagrams of exemplary methods of operating the system for detecting ground faults of FIG. 2.

A method of operating the disclosed ground fault detection system is described below with reference to FIGS. 2 and 3, as well as FIG. 5a. As depicted in block 502 (see FIG. 5a), (1) a first DC voltage value proportional to a level of a DC voltage on the positive (+DC) side of the DC bus 204 with respect to ground potential (see FIG. 2), (2) a second DC voltage value proportional to an amplitude of an AC voltage on the +DC side of the DC bus 204 with respect to ground potential, (3) a third DC voltage value proportional to a level of a DC voltage on the negative (−DC) side of the DC bus 204 with respect to ground potential, and (4) a fourth DC voltage value proportional to an amplitude of an AC voltage on the −DC side of the DC bus 204 with respect to ground potential are generated by the analog conditioning circuitry 302 (see FIG. 3) included in the ground fault detector 214. As depicted in block 504, the first, second, third, and fourth DC voltage values generated by the analog conditioning circuitry 302 are processed by the programmable microcontroller 304 by providing the respective DC voltage values as inputs into at least one algorithm. As depicted in block 506, the algorithm is executed by the programmable microcontroller 304 in accordance with one or more of a first set of parameter values in a case where the plurality of battery cells 203 are connected to the DC bus 204, and a second set of parameter values in a case where the plurality of battery cells 203 are disconnected from the DC bus 204, in which the first and second sets of parameter values are stored in the memory 306 associated with the programmable microcontroller 304. As depicted in block 508, the presence and location of at least one DC or AC ground fault within the energy storage and/or generation system 200 are detected based on results of the processing of the first, second, third, and fourth DC voltage values generated by the analog conditioning circuitry 302.

Figure 5B:
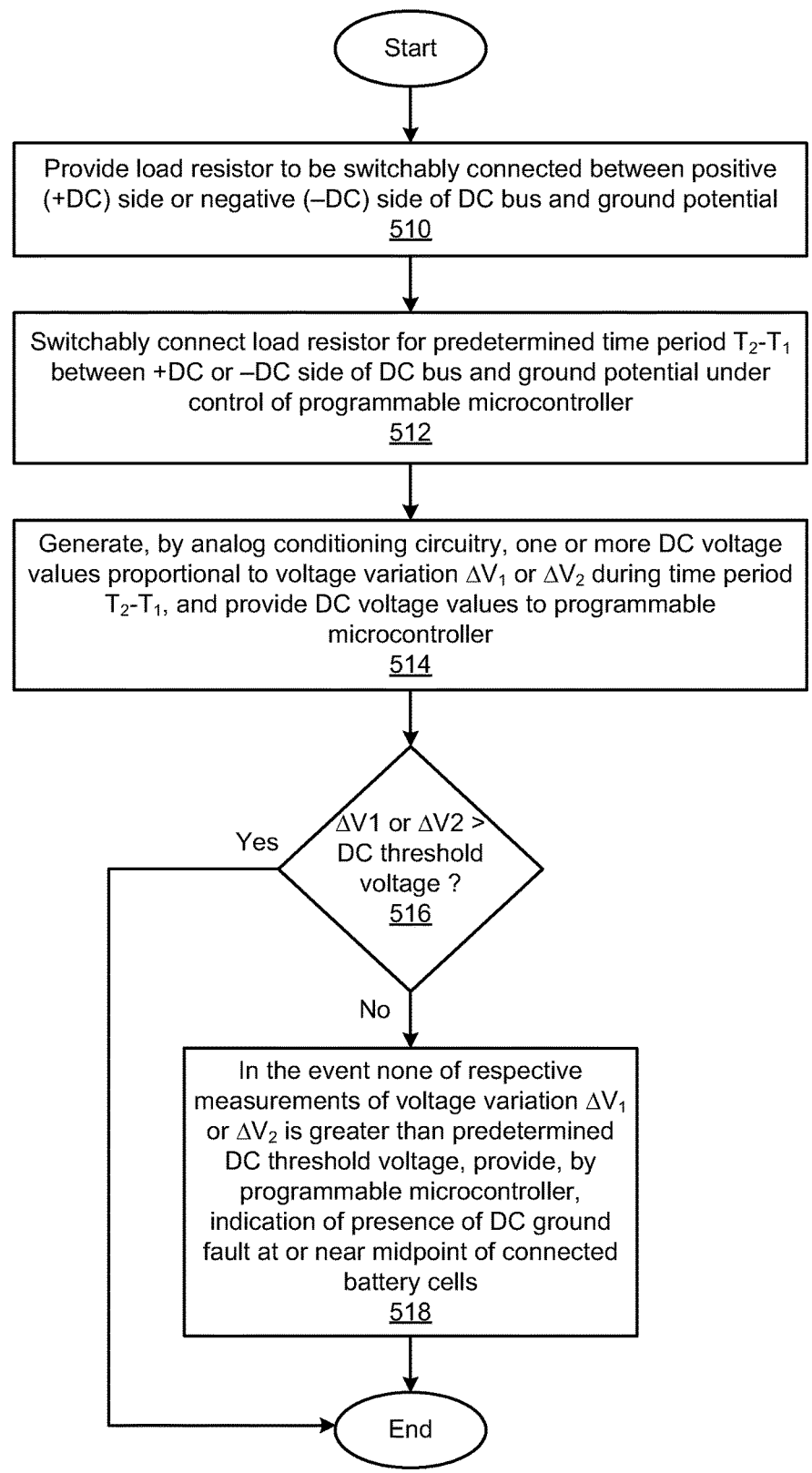

A further method of operating the disclosed ground fault detection system, for use in detecting a DC ground fault in the vicinity of the midpoint of the plurality of connected battery cells 203, is described below with reference to FIGS. 2-4b, as well as FIG. 5b. As depicted in block 510 (see FIG. 5b), the load resistor 220 (see FIGS. 2-4a) is provided to be switchably connected between the positive (+DC) side or the negative (−DC) side of the DC bus 204 (see FIGS. 2-4a) and ground potential. As depicted in block 512, the load resistor 220 is switchably connected for the predetermined time period $T_2-T_1$ (see FIG. 4b) between the +DC or −DC side of the DC bus 204 and ground potential under control of the programmable microcontroller 304 (see FIG. 3). As depicted in block 514, one or more DC voltage values proportional to the voltage variation $\Delta V_1$ or $\Delta V_2$ (see FIG. 4b) during the time period $T_2-T_1$ (see FIG. 4b) are generated by the analog conditioning circuitry 302 (see FIG. 3), and subsequently provided to the programmable microcontroller 304. As depicted in block 516, a determination is made, by the programmable microcontroller 304, as to whether any of the respective measurements of the voltage variation $\Delta V_1$ or $\Delta V_2$ is greater than a predetermined DC voltage threshold. As depicted in block 518, in the event none of the respective measurements of the voltage variation $\Delta V_1$ or $\Delta V_2$ is greater than the predetermined DC voltage threshold, an indication of the presence of a DC ground fault at or near the midpoint of the connected battery cells 203 is provided by the programmable microcontroller 304.

Having described the above illustrative embodiments of the disclosed systems and methods, modifications to and/or variations of these illustrative embodiments may be made. For example, the above-described exemplary algorithm(s) executable by the programmable microcontroller 304 (see FIG. 3) within the ground fault detector 214 (see FIG. 2) can be modified to employ one or more time constraints to enhance detection of the presence and location of DC and/or AC ground faults, as well as reduce the occurrence of false positive indications of such ground faults, within the energy storage and/or generation system 200. In order to achieve a balance between providing rapid ground fault detection (e.g., less than 1 second of delay) and avoiding spurious false positive indications due to transient effects, etc., such exemplary algorithm(s) can be modified to ignore certain ground fault conditions, to delay providing indications of certain ground fault conditions, and/or to take into account gradual changes in the DC voltage levels and/or AC voltage amplitudes that might occur on the DC bus 204. Specifically, such algorithm(s) can be modified to ignore certain ground fault conditions that persist for less than a predetermined time period, such as 0.5 second or any other suitable time period. Such ground fault conditions can pertain to DC ground faults, AC ground faults, or both DC and AC ground faults. Further, such predetermined time period(s) during which certain ground fault conditions may be ignored can be based on system operating characteristics such as transient effects caused by equipment switching within the system, expected power line disturbances, etc.

Moreover, such exemplary algorithm(s) can be modified to take into account gradual changes in the DC voltage levels and/or AC voltage amplitudes occurring on the DC bus 204 due to relatively large capacitances that might exist between the +DC side and/or the −DC side of the DC bus 204 and ground potential. For example, gradual changes in voltage readings on the DC bus 204 may occur when the plurality of battery cells 203 are disconnected from the DC bus 204, resulting in a relatively high level of impedance between the plurality of battery cells 203 and the DC bus 204 due to the high impedance measurement circuitry. Such a high level of impedance combined with the capacitance from the +DC side and/or the −DC side of the DC bus 204 and ground potential can cause the voltage readings on the DC bus 204 to increase substantially exponentially, but with a time constant of several seconds. While such voltage readings gradually increase on the DC bus 204, the DC voltage level or AC voltage amplitude occurring on the DC bus 204 might meet certain criteria for detection of a DC or AC ground fault, possibly resulting in a false positive indication of the DC or AC ground fault. By modifying such algorithm(s) to take readings of DC voltage levels and/or AC voltage amplitudes occurring on the DC bus 204 at relatively short predetermined time intervals, such as 0.1 seconds or any other suitable time interval, the algorithm(s) may be better able to distinguish between an actual ground fault condition characterized by a steady voltage on the DC bus 204, and the gradual charging of capacitance on the DC bus 204, which should not trigger a ground fault indication.

It was also described herein that the ground fault detector 214 (see FIG. 2) can include the analog conditioning circuitry 302 (see FIG. 3) and the programmable microcontroller 304 (see also FIG. 3). In an alternative embodiment, some or all of the analog conditioning circuitry 302 and programmable microcontroller 304 circuitry may be implemented using a programmable digital signal processor (DSP) and computer program memory, which can be programmed with the exemplary software algorithm(s) described herein to analyze the DC voltage levels and/or AC voltage amplitudes occurring on the DC bus 204 to detect the presence and location of a ground fault (e.g., DC ground fault, AC ground fault; see FIG. 3) and/or a malfunction (e.g., an invalid condition on the DC bus 204) within the energy storage and/or generation system 200.

It will be appreciated by those of ordinary skill in the art that further modifications to and/or variations of the above-described systems and methods may be made without departing from the inventive concepts disclosed herein. Accordingly, the invention should not be viewed as limited except as by the scope and spirit of the appended claims.

What is claimed is:

1. A method of detecting ground faults in an energy storage and/or generation system, the energy storage and/or generation system including a direct current (DC) energy storage and/or generation system, a DC bus, a DC-to-alternating current (AC) power conversion system, and an isolation transformer, the DC-to-AC power conversion system including a DC-to-AC bidirectional inverter, the DC bus being connected between the DC energy storage and/or generation system and the DC-to-AC bidirectional inverter, and the isolation transformer being connected between the DC-to-AC bidirectional inverter and an AC power grid, the method comprising:

monitoring, by analog conditioning circuitry, a level of a first DC voltage on a positive (+DC) side of the DC bus with respect to ground potential, an amplitude of a first AC voltage on the +DC side of the DC bus with respect to ground potential, a level of a second DC voltage on a negative (−DC) side of the DC bus with respect to ground potential, and an amplitude of a second AC voltage on the −DC side of the DC bus with respect to ground potential;

generating, by the analog conditioning circuitry, a first DC voltage value corresponding to the monitored level of the first DC voltage on the +DC side of the DC bus, a second DC voltage value corresponding to the monitored amplitude of the first AC voltage on the +DC side of the DC bus, a third DC voltage value corresponding to the monitored level of the second DC voltage on the −DC side of the DC bus, and a fourth DC voltage value corresponding to the monitored amplitude of the second AC voltage on the −DC side of the DC bus;

determining, by a programmable processor, whether the first DC voltage value and the third DC voltage value satisfy at least one condition for a DC ground fault within the energy storage and/or generation system, and whether the second DC voltage value and the fourth DC voltage value satisfy at least one condition for an AC ground fault within the energy storage and/or generation system; and having determined that at least one of the respective conditions for the DC ground fault and the AC ground fault is satisfied, generating, by the programmable processor, at least one output signal indicative of detection of one or more of the DC ground fault and the AC ground fault within the energy storage and/or generation system.

2. The method of claim 1 wherein the determining of whether the first DC voltage value and the third DC voltage value satisfy the at least one condition for the DC ground fault within the energy storage and/or generation system includes, in the event the difference between the first DC voltage value and the third DC voltage value is greater than or equal to a first predetermined DC voltage value, determining whether the first DC voltage value or the third DC voltage value is less than a second predetermined DC voltage value, the first predetermined DC voltage value and the second predetermined DC voltage value each corresponding to a different level of DC voltage on the DC bus with respect to ground potential.

3. The method of claim 1 wherein the determining of whether the first DC voltage value and the third DC voltage value satisfy the at least one condition for the DC ground fault within the energy storage and/or generation system includes, in the event the difference between the first DC voltage value and the third DC voltage value is greater than or equal to a first predetermined DC voltage value but less than a second predetermined DC voltage value, determining whether the first DC voltage value or the third DC voltage value is less than a third predetermined DC voltage value, the first predetermined DC voltage value, the second predetermined DC voltage value, and the third predetermined DC voltage value each corresponding to a different level of DC voltage on the DC bus with respect to ground potential.

4. The method of claim 1 wherein the determining of whether the second DC voltage value and the fourth DC voltage value satisfy the at least one condition for the AC ground fault within the energy storage and/or generation system includes determining whether the second DC voltage value or the fourth DC voltage value is greater than a predetermined DC voltage value, the predetermined DC voltage value corresponding to a predetermined amplitude of AC voltage on the DC bus with respect to ground potential.

5. The method of claim 1 further comprising:

monitoring, by the programmable processor, a voltage level between the +DC side or the −DC side of the DC bus and ground potential;

determining, by the programmable processor, whether the monitored voltage level satisfies at least one condition for a malfunction within the energy storage and/or generation system; and having determined that the at least one condition for the malfunction is satisfied, generating, by the programmable processor, at least one further output signal indicative of detection of the malfunction within the energy storage and/or generation system.

6. The method of claim 5 wherein the determining of whether the monitored voltage level satisfies the at least one condition for the malfunction within the energy storage and/or generation system includes determining whether the monitored voltage level is less than a predetermined voltage level.

7. The method of claim 1 wherein the determining of whether the first DC voltage value and the third DC voltage value satisfy the at least one condition for the DC ground fault, or whether the second DC voltage value and the fourth DC voltage value satisfy the at least one condition for the AC ground fault includes determining whether the respective condition persists for at least a predetermined time period.

8. The method of claim 7 wherein the generating of the at least one output signal includes generating the at least one output signal in the event the respective condition persists for at least the predetermined time period.

9. The method of claim 1 wherein the monitoring of the level of the first DC voltage on the +DC side of the DC bus, the amplitude of the first AC voltage on the +DC side of the DC bus, the level of the second DC voltage on the −DC side of the DC bus, and the amplitude of the second AC voltage on the −DC side of the DC bus includes monitoring each of at least some of the level of the first DC voltage, the amplitude of the first AC voltage, the level of the second DC voltage, and the amplitude of the second AC voltage at a predetermined time interval.

10. A system for detecting ground faults in an energy storage and/or generation system, the energy storage and/or generation system including a direct current (DC) energy storage and/or generation system, a DC bus, a DC-to-alternating current (AC) power conversion system, and an isolation transformer, the DC-to-AC power conversion system including a DC-to-AC bidirectional inverter, the DC bus being connected between the DC energy storage and/or generation system and the DC-to-AC bidirectional inverter, and the isolation transformer being connected between the DC-to-AC bidirectional inverter and an AC power grid, the system comprising:
  analog conditioning circuitry operative:
    to monitor a level of a first DC voltage on a positive (+DC) side of the DC bus with respect to ground potential, an amplitude of a first AC voltage on the +DC side of the DC bus with respect to ground potential, a level of a second DC voltage on a negative (−DC) side of the DC bus with respect to ground potential, and an amplitude of a second AC voltage on the −DC side of the DC bus with respect to ground potential; and
    to generate a first DC voltage value corresponding to the monitored level of the first DC voltage on the +DC side of the DC bus, a second DC voltage value corresponding to the monitored amplitude of the first AC voltage on the +DC side of the DC bus, a third DC voltage value corresponding to the monitored level of the second DC voltage on the −DC side of the DC bus, and a fourth DC voltage value corresponding to the monitored amplitude of the second AC voltage on the −DC side of the DC bus; and
  a programmable processor operative:
    to determine whether the first DC voltage value and the third DC voltage value satisfy at least one condition for a DC ground fault within the energy storage and/or generation system, and whether the second DC voltage value and the fourth DC voltage value satisfy at least one condition for an AC ground fault within the energy storage and/or generation system; and
    having determined that at least one of the respective conditions for the DC ground fault and the AC ground fault is satisfied, to generate at least one output signal indicative of detection of one or more of the DC ground fault and the AC ground fault within the energy storage and/or generation system.

11. The system of claim 10 wherein the programmable processor is further operative, in the event the difference between the first DC voltage value and the third DC voltage value is greater than or equal to a first predetermined DC voltage value, to determine whether the first DC voltage value or the third DC voltage value is less than a second predetermined DC voltage value, the first predetermined DC voltage value and the second predetermined DC voltage value each corresponding to a different level of DC voltage on the DC bus with respect to ground potential.

12. The system of claim 10 wherein the programmable processor is further operative, in the event the difference between the first DC voltage value and the third DC voltage value is greater than or equal to a first predetermined DC voltage value but less than a second predetermined DC voltage value, to determine whether the first DC voltage value or the third DC voltage value is less than a third predetermined DC voltage value, the first predetermined DC voltage value, the second predetermined DC voltage value, and the third predetermined DC voltage value each corresponding to a different level of DC voltage on the DC bus with respect to ground potential.

13. The system of claim 10 wherein the programmable processor is further operative to determine whether the second DC voltage value or the fourth DC voltage value is greater than a predetermined DC voltage value, the predetermined DC voltage value corresponding to a predetermined amplitude of AC voltage on the DC bus with respect to ground potential.

14. The system of claim 10 wherein the programmable processor is further operative:
  to monitor a voltage level between the +DC side or the −DC side of the DC bus and ground potential;
  to determine whether the monitored voltage level satisfies at least one condition for a malfunction within the energy storage and/or generation system; and
  having determined that the at least one condition for the malfunction is satisfied, to generate at least one further output signal indicative of detection of the malfunction within the energy storage and/or generation system.

15. The system of claim 14 wherein the programmable processor is further operative to determine whether the monitored voltage level is less than a predetermined voltage level.

16. The system of claim 10 wherein the programmable processor is further operative to determine whether the respective condition persists for at least a predetermined time period.

17. The system of claim 16 wherein the programmable processor is further operative to generate the at least one output signal in the event the respective condition persists for at least the predetermined time period.

18. The system of claim 10 wherein the analog conditioning circuitry is further operative to monitor each of at least some of the level of the first DC voltage, the amplitude of the first AC voltage, the level of the second DC voltage, and the amplitude of the second AC voltage at a predetermined time interval.

19. The system of claim 10 wherein at least some of the analog conditioning circuitry and the programmable processor are implemented using a programmable digital signal processor (DSP).

20. A method of detecting ground faults in an energy storage and/or generation system, the energy storage and/or generation system including a plurality of connected battery cells, a DC bus, a DC-to-alternating current (AC) power conversion system, and an isolation transformer, the DC-to-AC power conversion system including a DC-to-AC bidirectional inverter, the DC bus being connected between the plurality of connected battery cells and the DC-to-AC bidirectional inverter, and the isolation transformer being connected between the DC-to-AC bidirectional inverter and an AC power grid, the method comprising:

providing a load resistor to be switchably connected between a positive (+DC) side or a negative (−DC) side of the DC bus with respect to ground potential;

for a predetermined time period, switchably connecting the load resistor between the +DC side or the −DC side of the DC bus and ground potential;

during the predetermined time period, obtaining one or more DC voltage values corresponding to one or more changes in a DC voltage level on the +DC side or the −DC side of the DC bus with respect to ground potential;

determining whether the one or more changes in the DC voltage level satisfies at least one condition for a DC ground fault in the vicinity of a midpoint of the plurality of connected battery cells; and having determined that the least one condition is satisfied, generating at least one signal indicative of detection of the DC ground fault.

21. The method of claim 20 wherein the determining of whether the one or more changes in the DC voltage level satisfies the at least one condition for the DC ground fault includes determining whether or not the respective changes in the DC voltage level exceed a predetermined voltage level.

22. The method of claim 21 wherein the generating of the at least one signal indicative of detection of the DC ground fault includes generating the at least one signal in the event none of the respective changes in the DC voltage level exceeds the predetermined voltage level.

* * * * *